United States Patent [19]

Namekawa et al.

[11] Patent Number: 5,357,470
[45] Date of Patent: Oct. 18, 1994

[54] SEMICONDUCTOR MEMORY DEVICE HAVING REDUNDANCY MEMORY CELLS

[75] Inventors: Toshimasa Namekawa, Yokohama; Yoshio Okada, Tokyo, both of Japan

[73] Assignee: Kabushiki Kaisha Toshiba, Japan

[21] Appl. No.: 35,196

[22] Filed: Mar. 22, 1993

[30] Foreign Application Priority Data

Mar. 23, 1992 [JP] Japan .................................. 4-064979

[51] Int. Cl.$^5$ .............................................. G11C 7/00
[52] U.S. Cl. ..................... 365/200; 365/201; 365/225.7
[58] Field of Search ............... 365/200, 201, 49, 96, 365/203, 225.7; 371/10.1, 10.2, 10.3

[56] References Cited

U.S. PATENT DOCUMENTS

| | | | |
|---|---|---|---|
| 4,935,899 | 6/1990 | Morigami | 365/200 |
| 5,060,197 | 10/1991 | Park et al. | 365/200 |
| 5,224,073 | 6/1993 | Nakayama | 365/200 |
| 5,243,570 | 9/1993 | Saruwatari | 365/225.7 X |

*Primary Examiner*—Eugene R. LaRoche
*Assistant Examiner*—Son Mai
*Attorney, Agent, or Firm*—Banner, Birch, McKie & Beckett

[57] ABSTRACT

A semiconductor memory device includes a plurality of memory cell arrays, a plurality of decoders for decoding a first address of memory addresses, each of the decoders being connected to a corresponding memory cell array, and a plurality of sense amplifiers, each connected to a corresponding memory cell array. Also included are a decoder for decoding a second address of the memory addresses, the decoder being connected to every memory cell array, to be shared by every memory cell array, a plurality of redundancy memory cells, each of which is arranged for a corresponding memory cell array, and a plurality of programming circuits, each, arranged relative to a corresponding memory cell array to receive the first memory address and output a signal of a predetermined logic level corresponding to a defective memory cell in a memory cell array. Further, there is included a programmable decoder for receiving the second address and signal from the programming circuits, for changing a decoding state of the second address according to the logic level of the output signal from the programming circuits and for outputting a redundancy memory cell select signal which selects a redundancy memory cell in place of a specified defective memory cell.

16 Claims, 10 Drawing Sheets

F I G. 2

|  | F0 | F1 | F2 | F3 |
|---|---|---|---|---|
| PC0 |  | CUT OFF |  | CUT OFF |
| PC1 | CUT OFF |  | CUT OFF |  |
| PC2 | CUT OFF |  |  | CUT OFF |
| PC3 |  | CUT OFF | CUT OFF |  |

SEMICONDUCTOR MEMORY DEVICE HAVING REDUNDANCY MEMORY CELLS

BACKGROUND OF THE INVENTION

1. Field of the Invention

The present invention relates to a semiconductor memory device, and in particular, one having a redundancy memory cell and an improvement of its means for remedying a defective memory.

2. Description of the Related Art

In the existing semiconductor memory device not only normal access is gained to a memory but also a defective memory cell is remedied by replacing the defective memory cell.

Figure 8:
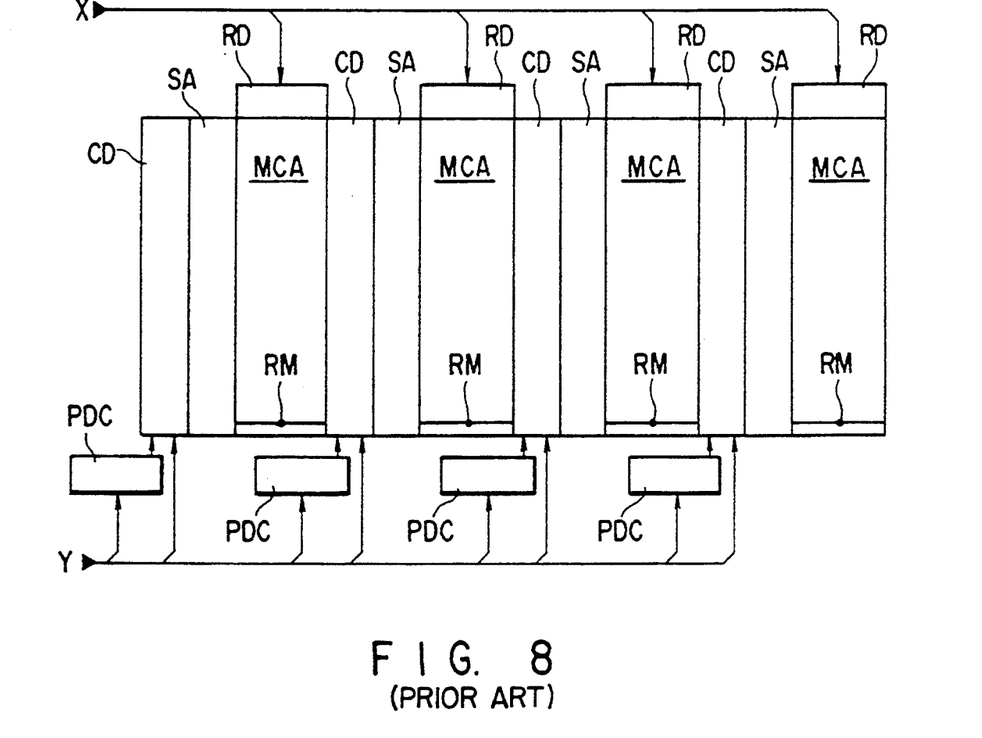
FIG. 8 is a first circuit diagram showing a configuration of a conventional semiconductor memory device including redundancy memory cells.

FIG. 8 is a block diagram showing the arrangement of an existing semiconductor memory having the aforementioned redundancy memory cells. The memory in FIG. 8 is divided into four memory arrays MCA's. In addition to column decoders CD, row decoders RD and sense amplifiers SA, one row of redundancy memory cells R is provided for each of the memory cell arrays. X denotes row addresses input to the row decoder RD and Y denotes column addresses input to the column decoder CD.

In this case, means is provided for replacing any defective memory cell by a redundancy memory cell. Replacement is carried out by programming the column address of any defective memory cell in a programmable decoder PDC provided relative to the memory cell in question.

Figure 9:
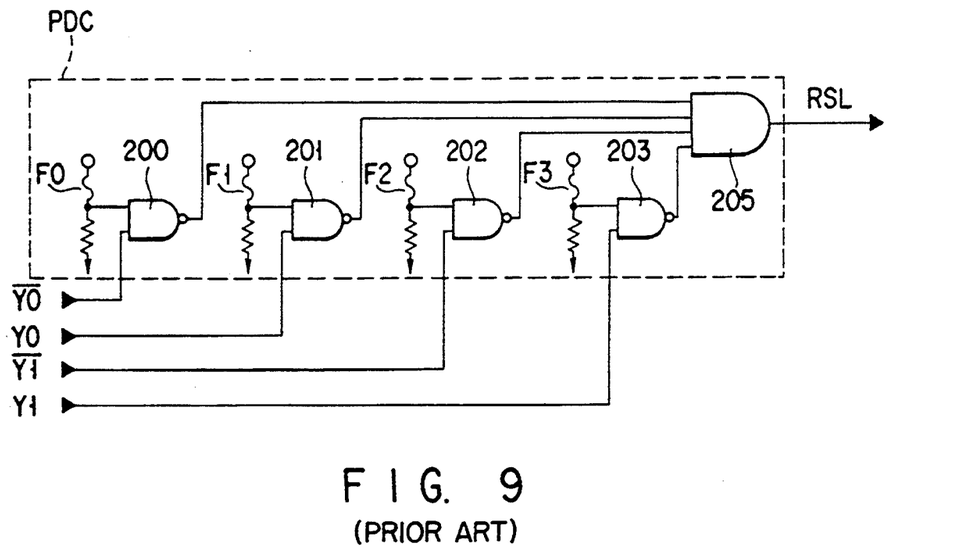
FIG. 9 is a part of the circuit diagram shown in FIG. 8.

FIG. 9 is a circuit diagram of an example of a programmable decoder PDC shown enclosed by a broken line in FIG. 8. One input of each of NAND gates 200, 201, 202 and 203 is initially controlled, by a corresponding one of fuses F0, F1, F2 and F3, on the basis of address information of a corresponding defective cell. A corresponding column address line is connected to the other input of the respective NAND gate. The outputs of the NAND gates 200, 201, 202, and 203 are supplied to a 4-input AND gates 205 and, upon receipt of 10 a column address of any defective memory cell, the AND gate 205 inhibits the selection of a normal memory cell and delivers a redundancy memory cell select signal RSL to a redundancy memory cell select line, not shown.

In recent years, high integration density has been achieved in memory devices involving a larger number of divided memory cell arrays. Therefore, high integration density cannot be achieved if the memory cell arrays as shown in FIG. 8 are adopted. As a countermeasure, a plurality of memory cell arrays are arranged so as to share a column decoder or row decoder or both.

Figure 10:
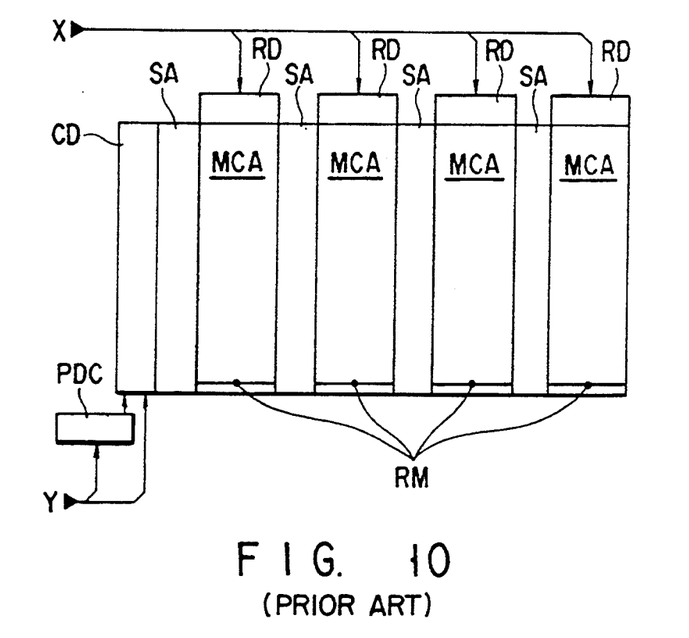
FIG. 10 is a second circuit diagram showing a configuration of a conventional semiconductor memory device including redundancy memory cells.

FIG. 10 shows an example of the arrangement of an existing semiconductor memory where a plurality of memory cell arrays share a column decoder. In this arrangement, row decoders RD, sense amplifiers SA, and a row of redundancy memory cells RM are arranged for the memory cell arrays MCA, and all the memory cell arrays share a single column decoder CD.

In the aforementioned arrangement, the replacement of a defective memory cell by a corresponding redundant memory cell is implemented through the initial programming of the column address of the defective memory cell. The programmable decoder PDC has an arrangement such as that shown in FIG. 9. Specifically, the column address line is connected to the programmable decoder and, upon receipt of a column address corresponding to any defective memory cell, the decoder inhibits the selection of any normal memory cell and delivers a corresponding redundancy memory cell select signal.

In the arrangement shown in FIG. 10, however, a lower percentage of defective memory cell replacement is expected as compared with the arrangement shown in FIG. 8. Let it be assumed that memory cells each having different column addresses are defective in each of the memory arrays. In the arrangement shown in FIG. 8, as a remedial measure for the defective memory cell, the column address corresponding to the defective memory cell is programmed for the programmable decoder PDC provided relative to the memory cell array, whereby it is possible to replace the respective defective memories. In the arrangement shown in FIG. 10, only one programmable decoder PDC is provided for storing the column addresses of the defective memory cells, failing to remedy the aforementioned defects.

Since only the column address of one defective memory cell is programmed in the programmable decoder in the case where the respective cell arrays share the column decoder, there is a drop in the remedial percentage of defective memory cells. In order to cope with this problem, a plurality of programmable decoders may be prepared, in which case the defective memory cells of the memory cell arrays at different column addresses can be replaced through a logical operation between the output of the programmable decoder and a memory cell array select signal.

Figure 11:
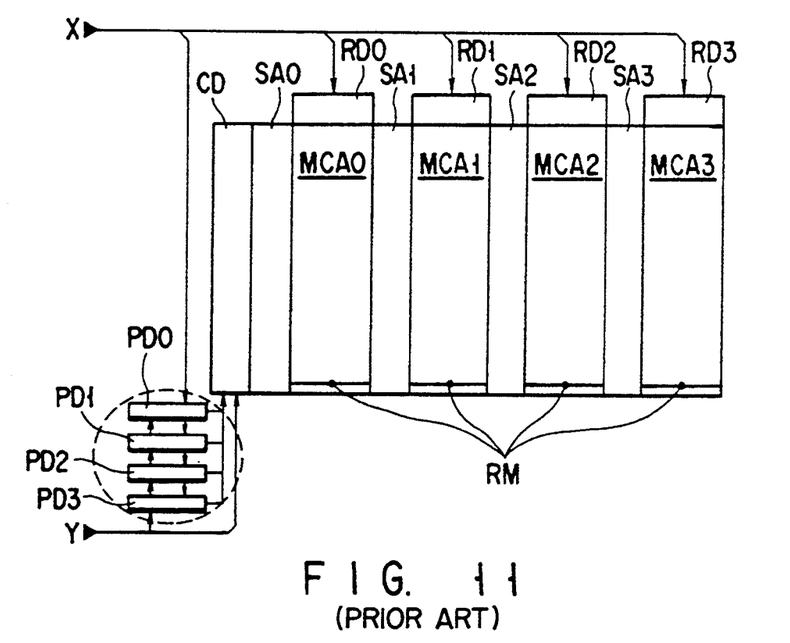
FIG. 11 is a third circuit diagram showing a configuration of a conventional semiconductor memory device including redundancy memory cells.

FIG. 11 is an example of the aforementioned arrangement in which four programmable decoders PD0, PD1, PD2, and PD3 are prepared and the defective memory cells of the memory cell arrays at different column addresses can be replaced by connecting the output of the programmable decoder to a portion of the row address.

Let it be assumed that in the arrangement of FIG. 11, 4-bit row addresses (X0, X1, X2, X3) and 2-bit column addresses (Y0, Y1) are entered and access is gained to one memory cell. A semiconductor memory in FIG. 11 is divided into four memory cell arrays MCA0, MCA1, MCA2, and MCA3 and the 2-bit row addresses (X2, X3) are employed to select a memory cell array to be accessed. The remaining 2-bit row addresses (X0, X1) are connected to row decoders RD0, RD1, RD2, and RD3 and used to select a row select line in the memory cell array. Further, the column addresses (Y0, Y1) are connected to the column decoder CD and used to select a column select line.

Figure 12:
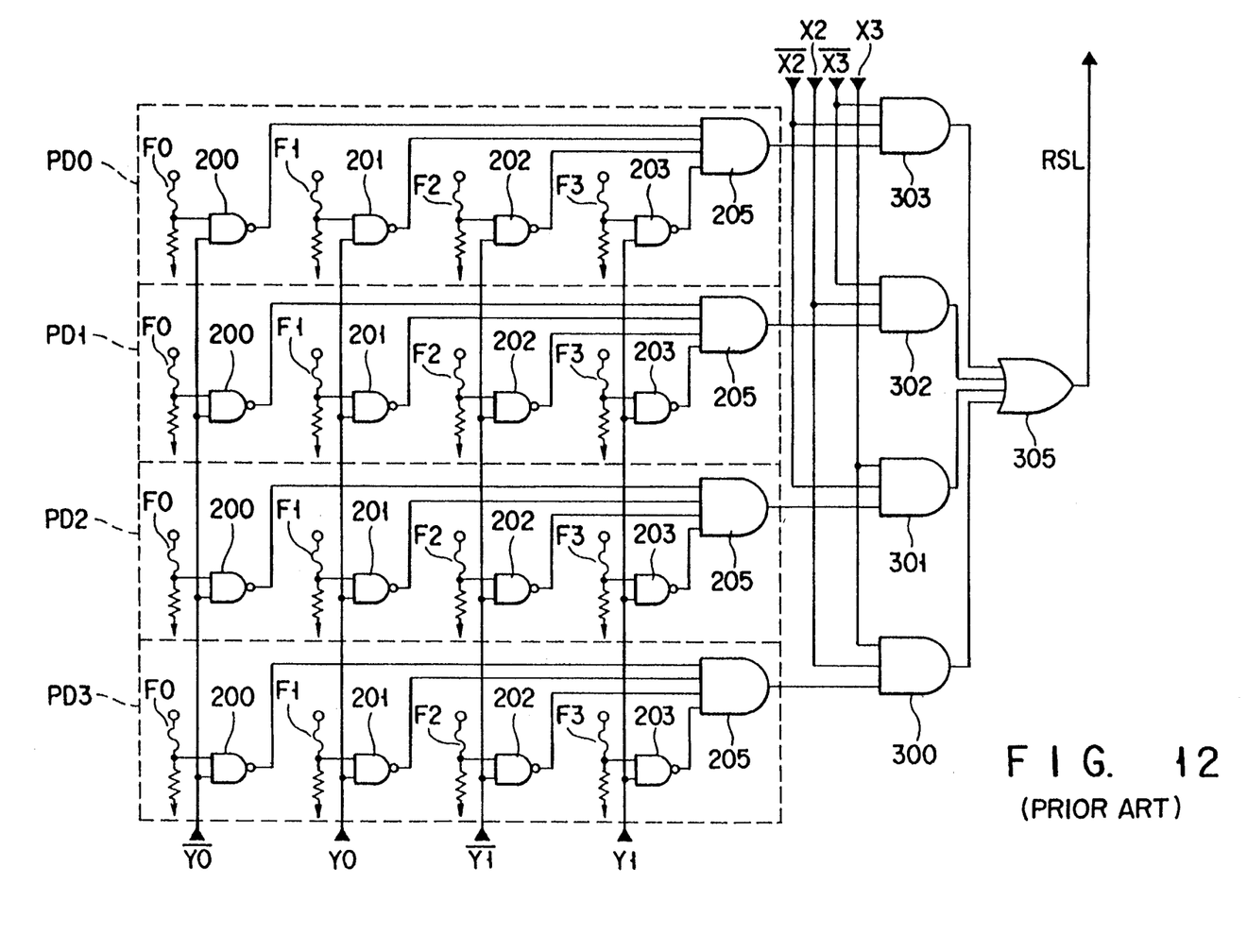
FIG. 12 is a part of the circuit diagram shown in FIG. 11.

FIG. 12 is a circuit diagram of a connection arrangement of four programmable decoders PD0, PD1, PD2, and PD3 shown enclosed by a broken line in FIG. 11. These programmable decoders are the same in arrangement as the programmable decoder shown in FIG. 9, and their outputs are supplied to the first inputs of 3-input AND gates 300, 301, 302, and 303, respectively. In order to perform respective predetermined operations, the AND gates 300, 301, 302, and 303 are logically combined using the aforementioned 2-bit row addresses (X2, X3), and their outputs are connected to a 4-input OR gate 305. The OR gate 305 delivers a redundancy memory cell select signal RSL as an output and is coupled to a redundancy memory cell select line (not shown) in the column decoder.

The column addresses (Y0, Y1) and row addresses (x2, X3) for selecting a corresponding memory cell array are input to the respective programmable decoders PD0, PD1, PD2, and PD3. By so doing, the column address of any defective memory cell in the corresponding memory cell array is programmed in the corresponding programmable decoder.

Figure 13:
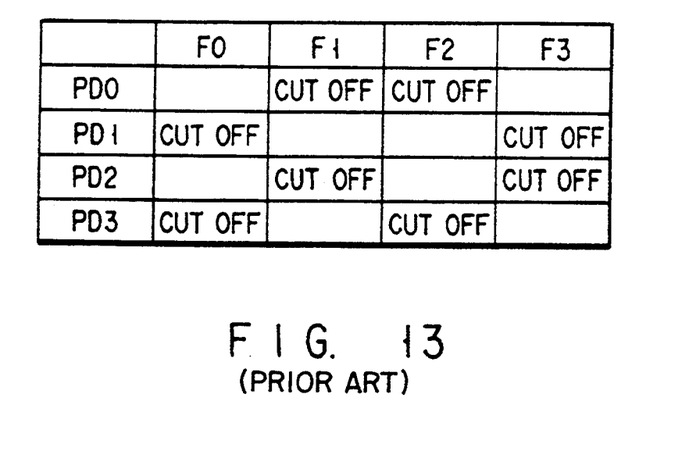
FIG. 13 is a table showing an example of a cutting state of fuses in FIG. 12.

Here, let it be assumed that the memory cell arrays, 1, 2, 3, and 0 correspond, as the column addresses of defective memory cells, to MCA0, MCA1, MCA2, and MCA3, respectively. In this case, 1, 2, 3 and 0 are programmed in the programmable decoders PD0, PD1, PD2, and PD3, respectively. This program is achieved by blowing out the corresponding fuses F0, F1, F2, and F3. FIG. 13 shows cut-off spots of the respective fuses.

Figure 14:
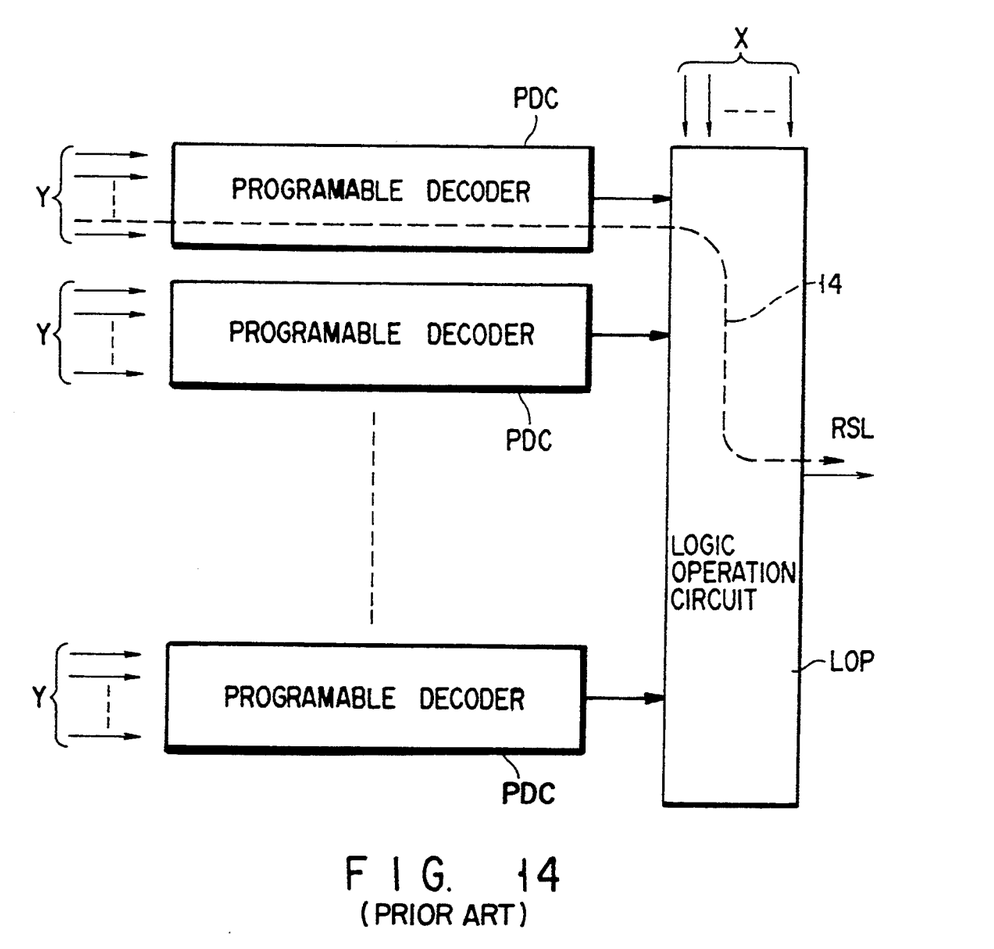
FIG. 14 is a conventional schematic diagram showing a path of a defective memory cell replacement signal.

FIG. 14 is a schematic diagram showing signal paths for the replacing of defective memory cells in the arrangement shown in FIG. 12. In the arrangement shown in FIG. 14, column addresses (Y) are input to corresponding programmable decoders. In the case of a semiconductor memory such as a DRAM, in which addresses are multiplexed, normally the row address (X) is input first and then the column address (Y) is input.

A critical path for obtaining a redundancy memory cell select signal RSL after the inputting of the address corresponds to a signal path run through a logic operation circuit LOP from the programmable decoder PDC indicated by a broken line in FIG. 14.

In the logic operation of a signal delivered from the respective programmable decoders in the arrangement shown in FIG. 12, there is a time delay from the inputting of the column address to the determination of the selection of a redundancy memory cell select line. This time delay cannot be ignored if the number of divided memory cells is increased.

In addition to the aforementioned conventional examples, other practical arrangements may be considered as programmable decoders. Since, however, the column addresses are connected to the inputs of respective programmable decoders, there is a time delay until a redundancy memory cell select signal is finally obtained after a logic operation has been performed past the programmable decoder subsequent to the inputting of the column address.

To alleviate this problem, the logic operation on the output of the programmable decoder may be performed in a cascade-connected configuration. However, in this case, a parasitic capacitance on the node of the cascade connection is increased due to an increase in the number of programmable decoders. Therefore, the cascade connection of logic circuits for logic operation on their outputs does not result in a shortening of the time from the inputting of the column address to the outputting of the redundancy memory cell select signal.

Due to the current trend toward higher integration density of existing semiconductor memories, the circuit arrangement high in a remedial percentage of defective memory cells becomes complex and, due to an increase in the number of divided memory cells involved, the time until a redundancy memory cell select signal is output increases.

The present invention has been developed taking the above-mentioned factors into consideration, and its object is to provide a semiconductor memory device which, even thought it contains a plurality of divided memory cell arrays, can replace defective memory cells with minimum delay and replace a high percentage of defective cells.

SUMMARY OF THE INVENTION

It is accordingly the object of the present invention to provide a semiconductor memory device which comprises a plurality of divided memory cell arrays sharing a column decoder for decoding a column address of the memory addresses, a row decoder for decoding a row address of the memory addresses, or both. Redundancy memory cells are also provided in a column direction or a row direction, or in both the directions of the memory cell arrays. Also included are plurality of programming circuits connected to receive the row address or a signal sought from the row address and having a programming function; and a programmable decoder connected to receive output signals of the programming circuits, the column address or a signal sought from the column address and having its decoding state varied based on those output signals of the programming circuit. Whether or not a specific one of memory cells in the memory cell array is replaced by a corresponding redundancy memory cell in the column direction is determined in accordance with an output of the programmable decoder.

According to the present invention, the memory addresses are utilized in multiplexed fashion. In the case where the row address is input earlier than the column address, the programming circuits are operated through the use of the earlier input row address so as to replace a defective memory cell in the column direction. Since the column address is not connected to the input of the programming circuit, the output of the programming circuit is determined prior to the inputting of the column address. The programmable decoder having its decoding state varied by the output of the programming circuit delivers a signal indicating whether or not a redundancy memory cell is selected, within a short time of inputting the column address.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description provided above and the detailed description of the preferred embodiments set out below, serve to explain the principles of the invention.

DETAILED DESCRIPTION OF THE PREFERRED EMBODIMENTS

The embodiments of the present invention will be explained in more detail below, with reference to the accompanying drawings.

Figure 1:
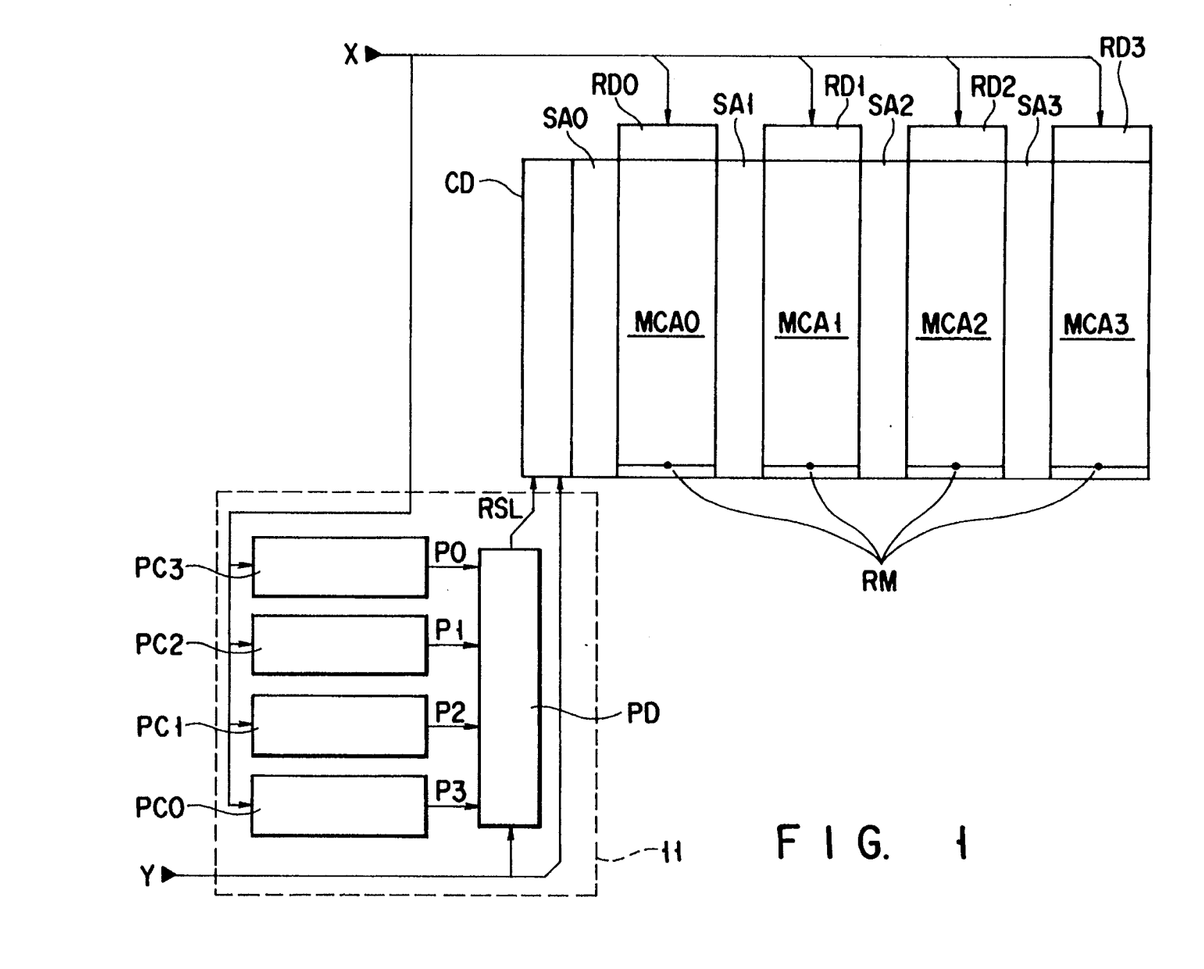
FIG. 1 is a schematic block diagram showing an embodiment of the present invention in its entirety.

FIG. 1 is a circuit diagram showing one embodiment of the present invention. A semiconductor memory used in this embodiment is substantially the same as shown in FIG. 8. Specifically, the semiconductor memory includes four divided memory cell arrays MCA0, MCA1, MCA2, and MCA3, a column decoder CD shared by the memory cell arrays and redundancy memory cells RM provided each for a corresponding memory cell array. SA0, SA1, SA2, and SA3 denote sense amplifiers corresponding to the four memory cell arrays. Access is gained to a memory cell by way of a row address (X) and a column address (Y).

The row address comprises four bits (X0, X1, X2, X3) and, of this 4-bit configuration, the upper two bits (X2, X3) are used to select one of the four memory cells, and the lower two bits (X0, X1) are coupled to the row decoders RD0, RD1, RD2, and RD3, provided one in each of the memory cell arrays, and used to select a row select line in the memory cell array. The column address is comprised of a 2-bit (Y0, Y1) configuration and connected to the column decoder CD and used to select a column select line.

An arrangement for the replacement of defective memory cells is indicated by a block 11 in the embodiment shown in FIG. 1. Four programming circuits PC0, PC1, PC2, and PC3 are arranged so as to be connected to the row addresses (X), and a programmable decoder PD is arranged so as to be connected to the column address (Y). The programmable decoder has its decoding state varied by program signals P0, P1, P2, and P3 which are delivered from the programming circuits. As a result, the programmable decoder delivers a signal indicating whether or not a redundancy memory cell is selected, and hence whether a redundancy memory cell select signal RSL should be sent to a redundancy memory cell line in the column decoder CD.

According to the aforementioned arrangement, the column address (Y) is not connected to the programming circuit and the row address (X) is connected thereto, so that when a row address is input, the program signal line is determined prior to the inputting of the column address and the decoding state of the next-stage programmable decoder PD can be determined.

Figure 2:
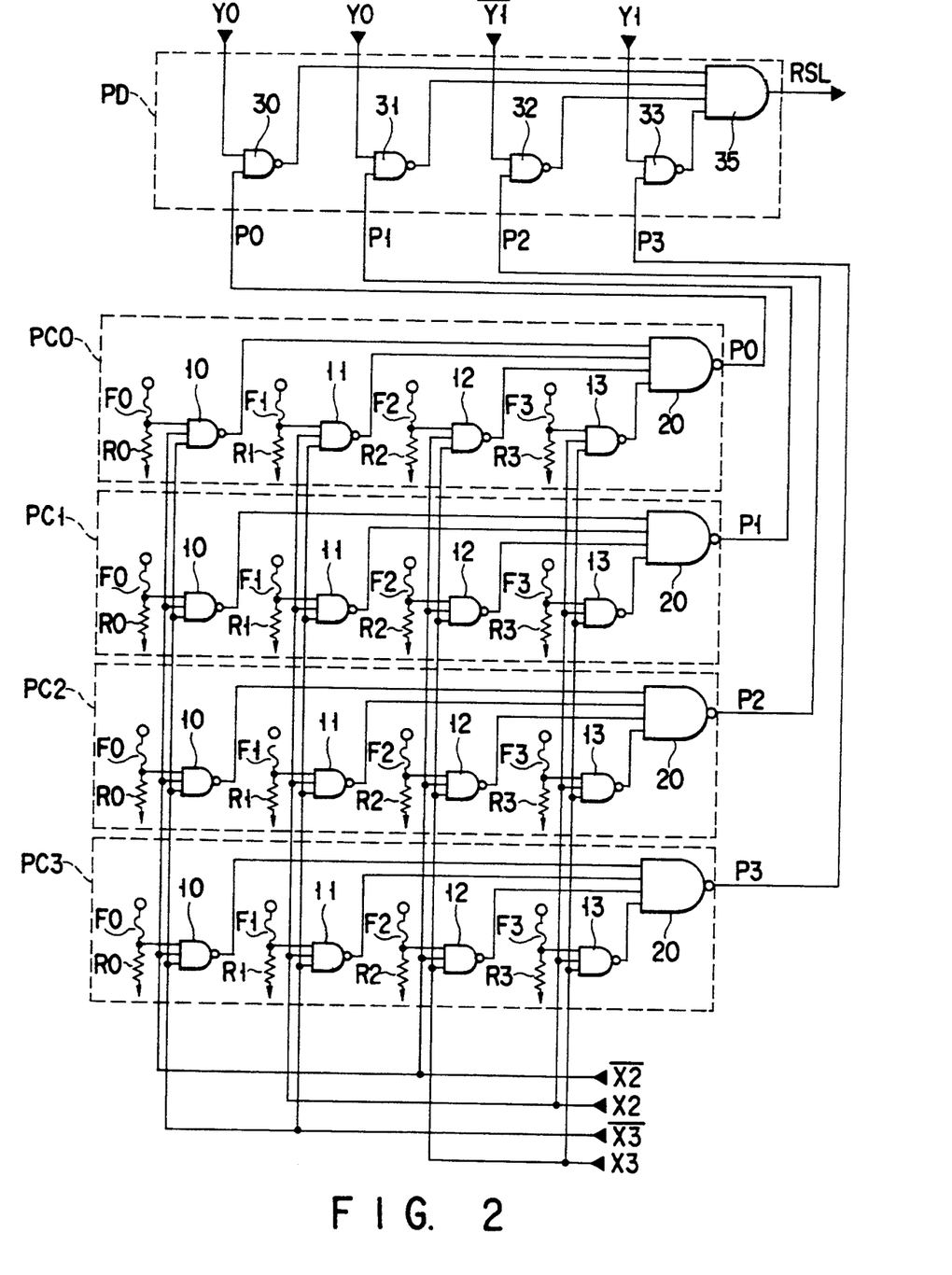
FIG. 2 shows one block of the block diagram of FIG. 1.

FIG. 2 shows a major section of a circuit arrangement according to one embodiment of the present invention, the circuit arrangement being indicated by a block 11 shown in FIG. 1 and used for the replacement of defective memory cells.

The programming circuits PC0, PC1, PC2 and PC3, each, comprise 3-input NAND gates 10, 11, 12, and 13, and 4-input NAND gate 20 whose inputs are connected to the outputs of the NAND gates 10, 11, 12, and 13. The first inputs of the NAND gates 10, 11, 12, and 13 are initially controlled, by fuses F0, F1, F2, and F3, on the basis of the address information of defective memory cells. The fuses F0, F1, F2, and F3 are each connected at one terminal to a power supply and at the other terminal to ground via a corresponding one of resistors R0, R1, R2, and R3. Of the aforementioned row addresses for memory cell array selection, upper addresses (X2, X3) or their inverted replicas are connected to the second and third inputs to the NAND gates 10, 11, 12, and 13, as shown in FIG. 2. In the arrangement shown, respective program signals P0, P1, P2, and P3 are output from 4-input NAND gates 20, 20, 20, and 20, respectively, in the programming circuits PC0, PC1, PC2, and PC3. The outputs of the NAND gates 20 are supplied to the programmable decoder PD.

The programmable decoder PD comprises NAND gates 30, 31, 32, and 33, each supplied at one terminal with a corresponding one of column addresses (Y0, Y1) and their inverted replicas, and an AND gate 35 supplied with the respective outputs of the NAND gates 30, 31, 32, and 33. The program signals P0, P1, P2, and P3, are each connected to the other terminal of a corresponding one of the NAND gates 30, 31, 32, and 33. The AND gate 35 delivers as an output a redundancy memory cell select signal for determining whether or not a redundancy memory cell is selected.

The operation for replacing defective memory cells according to the present invention will be explained in more detail below, with reference to the arrangement shown in FIG. 2. First, the column address is sought for each memory cell array shown in FIG. 1. Here, let it be assumed that, as in the case of the existing example set out in connection with the situation of defective memory cells, a different column address is provided for each of the memory cell arrays MCA0, MCA1, MCA2, and MCA3, and that 1, 2, 3, and 0 correspond to MCA0, MCA1, MCA2, and MCA3, respectively. In the case where the memory cell to be accessed is defective, programming is made in the four programming circuits PC0, PC1, PC2, and PC3 on the basis of a column address of the defective memory cell so that the next-stage programmable decoder PD can deliver a true value. In this case, the program of the programming circuits, i.e., the cut-off states of the fuses F0, F1, F2, and F3, is shown in FIG. 3.

Figure 3:
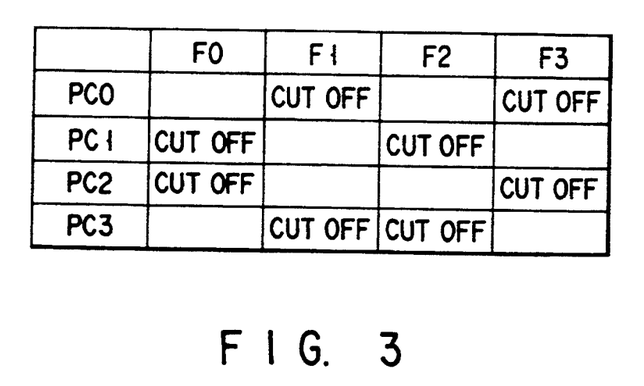
FIG. 3 shows a cutting state of fuses incorporated in the block of FIG. 2.

The cut-off states of the fuses F0, F1, F2, and F3 in FIG. 3 are, when compared with these existing ones, transposed. In other words, in the case of the existing method, the fuses are arranged one for each memory cell array, whereas according to the present invention, the fuses are arranged for each bit of the column address.

The cutting off of the fuses will now be explained below. Here, let it be assumed that with the row address entered, a given memory cell is selected from the memory cell array MCA0. Since, in MCA0, a memory cell whose column address is 1 is defective, it is necessary to determine the decoding state of the programmable decoder PD such that the redundancy memory cell select line in the column decoder CD goes high (H) when the column address later entered is 1 and goes low (L) when it is in an other state. To put it another way, it is necessary to place a program with the programmable decoder PD shown in FIG. 2 in the same decoding state as the programmable decoder in FIG. 12.

In the existing example shown in FIG. 12, the blowing or cutting off of the fuse is equivalent to making the program signal (FIG. 2) go low (L). Thus, the programming circuits PC0, PC1, PC2, and PC3 are programmed so as to make P0, P1, P2, and P3 correspond to "H", "L", "L", and "H", respectively.

In the respective programming circuits PC0, PC1, PC2 and PC3, four fuses F0, F1, F2, and F3 are provided in correspondence to the four memory cell arrays. Programming of the memory cell array MCA0 is performed by blowing the fuse F0 in the corresponding programming circuits. In order to obtain the aforementioned program signals, it is necessary only to cut off the fuses F0 and F0 in the programming circuits PC1 and PC2, respectively.

In this way, programming is made for the column address of a defective memory cell in the memory cell array MCA0 by cutting off the fuse F0 in the corresponding programming circuits. Similarly, programming is made by cutting off the fuses F1, F2, and F3 for MCA1, MCA2, and MCA3, respectively.

In the case where memory cell in MCA0 is accessed using the programming circuits PC0, PC1, PC2, and PC3 programmed, PC0, PC1, PC2, and PC3 deliver program signals, as output signals, corresponding to "H", "L", "L", and "H". Upon receipt of these program signals, the programmable decoder PD generates a redundancy memory cell select signal RSL, i.e., an "H" signal when the column address corresponds to 1 or an "L" signal when the column address corresponds to a value other than 1.

In the case where memory cell in MCA1 is accessed, the programming circuits PC0, PC1, PC2, and PC3 deliver program signals P0, P1, P2, and P3, as output signals, corresponding to "L", "H", "H", and "L". Upon receipt of these program signals, the programmable decoder PD generates a redundancy memory cell select signal RSL, i.e., an "H" signal when the column address corresponds to 2, and an "L" signal when the column address corresponds to a value other than 2.

Similarly, in the case where a memory cell in MCA2 is accessed, the program signals P0, P1, P2, and P3 correspond to "H", "L", "H", and "L", and the programmable decoder PD generates a redundancy memory cell select signal RSL, i.e., an "H" signal when the column address corresponds to 3, and an "L" signal when the column address corresponds to a value other than 3.

Similarly, in the case where a memory cell in MCA3 is accessed, the program signals P0, P1, P2, and P3 correspond to "L", "H", "L", and "H", the programmable decoder PD generates a redundancy memory cell select signal RSL, i.e., an "H" signal when the column address corresponds to 0, and an "L" signal when the column address corresponds to a value other than 0.

Although, in the aforementioned embodiment, a defective memory cell replacement means has been explained in connection with a very small semiconductor memory of 4-bit row address X 2-bit column address type, a similar defective memory cell replacement means can be configured in an ordinary semiconductor memory of several tens of bits of row address X several tens of bits of column address.

Figure 4:
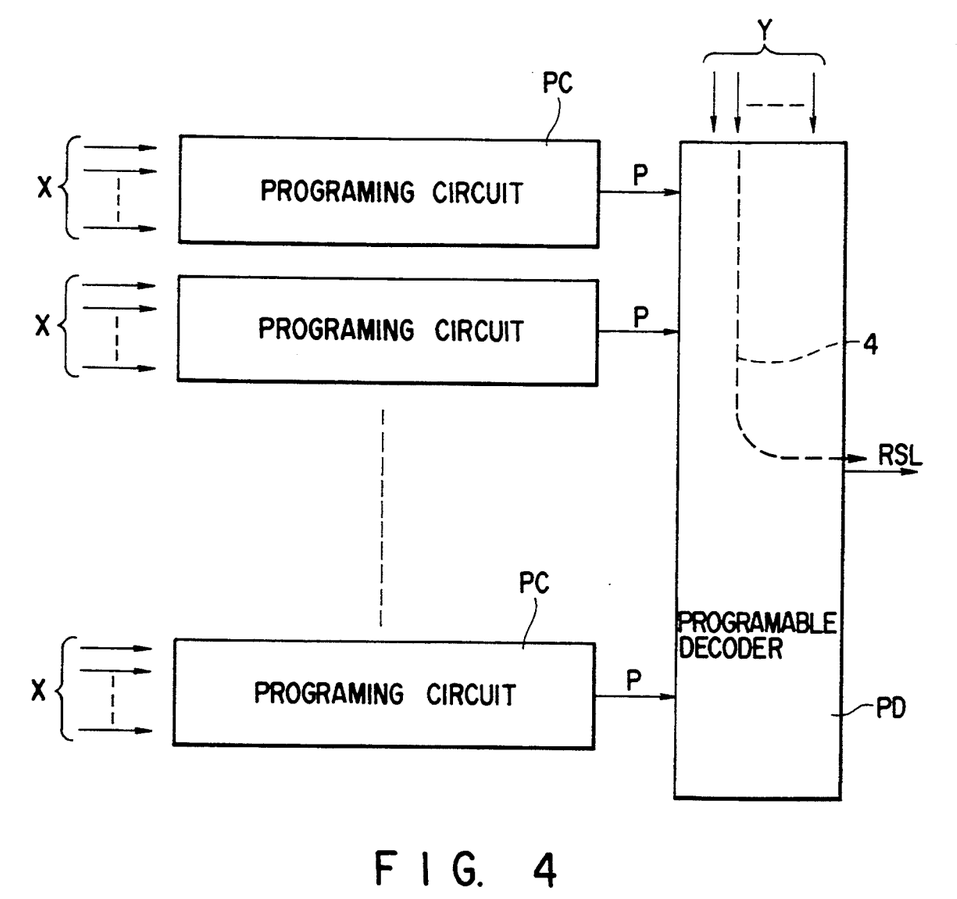
FIG. 4 shows current paths of signals for defective memory cell replacement.

FIG. 4 is a schematic diagram showing a signal path for defective memory replacement in the arrangement of the present invention. According to the present invention, the row address (X) is connected to the programming circuit PC and the column address (Y) is not connected thereto. When the row address is entered, a program signal P, which is an output of the programming circuit, is determined prior to the inputting of the column address and upon receipt of the program signal P, the programmable decoder PD has its decoding state determined. It is therefore possible for the programmable decoder to deliver a redundancy memory select signal with only a small delay time from the inputting of the column address. Thus, a critical path from the inputting of the address to the generation of the redundancy memory cell select signal RSL is indicated by a broken line 4 in FIG. 4, showing that it is shortened considerably as compared to the path of the existing example shown in FIG. 14.

In this case, an increase in the number of divided memory cell arrays leads to an increase in the number of fuses, while an increase in the number of column addresses results in an increase in the number of programming circuits.

Figure 5:
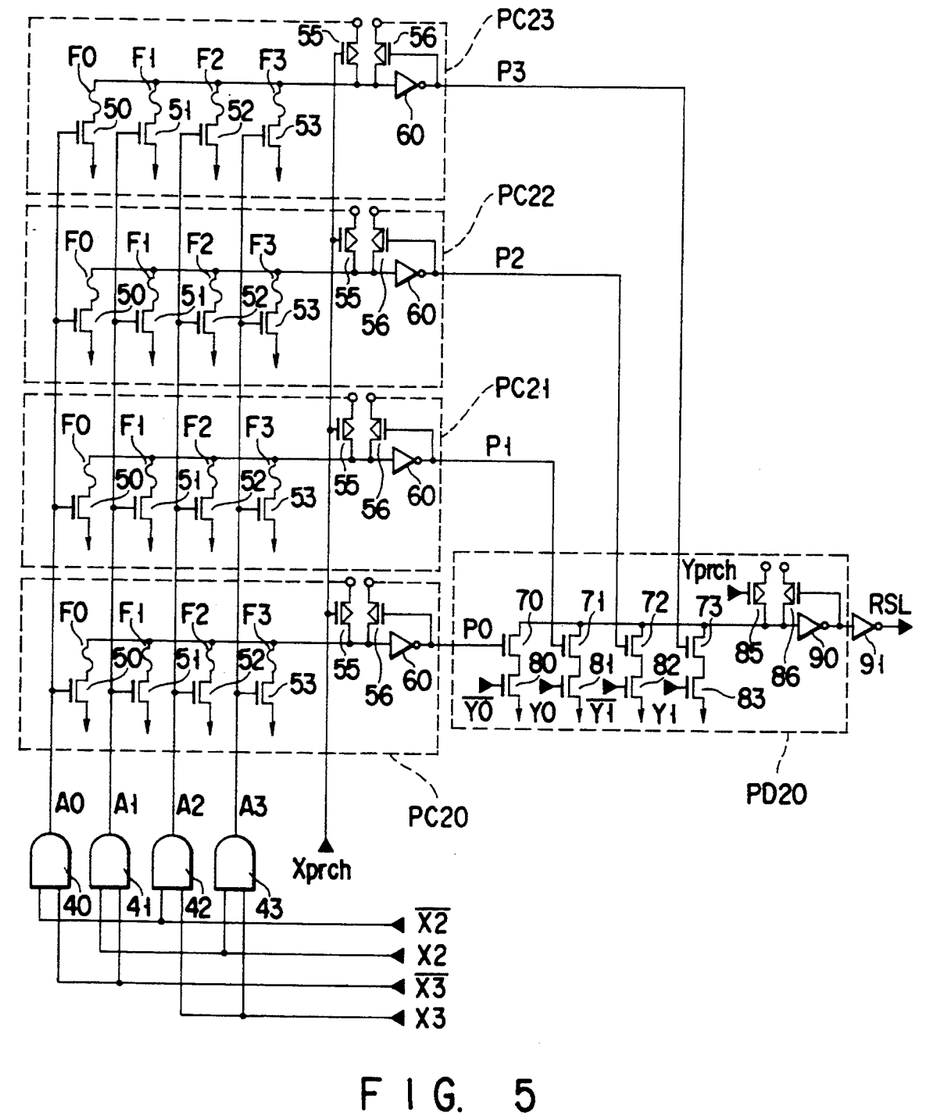
FIG. 5 shows another block of the block diagram of FIG. 1.

FIG. 5 is a circuit diagram showing a major section of a second embodiment of the present invention—specifically, a circuit diagram for defective memory replacement in the arrangement of the block 11 shown in FIG. 1.

Programming circuits PC20, PC21, PC22, and PC23 are arranged as follows. N channel MOS transistors 50, 51, 52, and 53 are each connected at a drain to one terminal of a corresponding one of fuses F0, F1, F2, and F3. Memory cell array select signals A0, A1, A2, and A3 are input to the gates of MOS transistors 50, 51, 52, and 53, respectively, and predecode upper addresses (X2, X3) of row addresses or their inverted ones through AND gates 40, 41, 42, and 43, respectively.

P channel MOS transistors 55 and 56 for power supply are each connected at a drain to the other terminal of a corresponding one of the fuses F0, F1, F2, and F3. A signal Xprch representing that the row address is determined is input to the gate of MOS transistor 55. An inverter 60 for delivering a program signal is connected across the drain and the gate of MOS transistor 56. With this arrangement, the programming circuits PC20, PC21, PC22, and PC23 deliver program signals P0, P1, P2, and P3, respectively, via the corresponding inverters 60, 60, 60, and 60.

A programmable decoder PD20 comprises N-channel MOS transistors 70, 71, 72, and 73 for receiving the programs P0, P1, P2, and P3, respectively, N channel MOS transistors 80, 81, 82, and 83 connected to the sources of MOS transistors 70, 71, 72, and 73, P channel MOS transistors 85 and 86 for power supply to the transistors 70 to 73 and 80 to 83, and an inverter 90 connected to a drain-to-gate circuit of MOS transistor 86.

A signal Yprch showing that the column address is determined is input to the gate of MOS transistor 85. A redundancy memory cell select signal RSL is delivered through the inverters 90 and 91 to a redundancy memory cell select line in the column decoder.

In the embodiment shown in FIG. 5, it is possible to obtain the same advantage as in the arrangement shown in FIG. 2. Specifically, unless the column addresses are connected to the programming circuits P20, P21, P22, and P23, the output of the programming circuit can be determined prior to the inputting of the column address. For this reason, the programmable decoder PD20 having its decoding state varied by the output of the programming circuit can deliver a redundancy memory cell select signal RSL with only a small delay time from the inputting of the column address.

Figure 6:
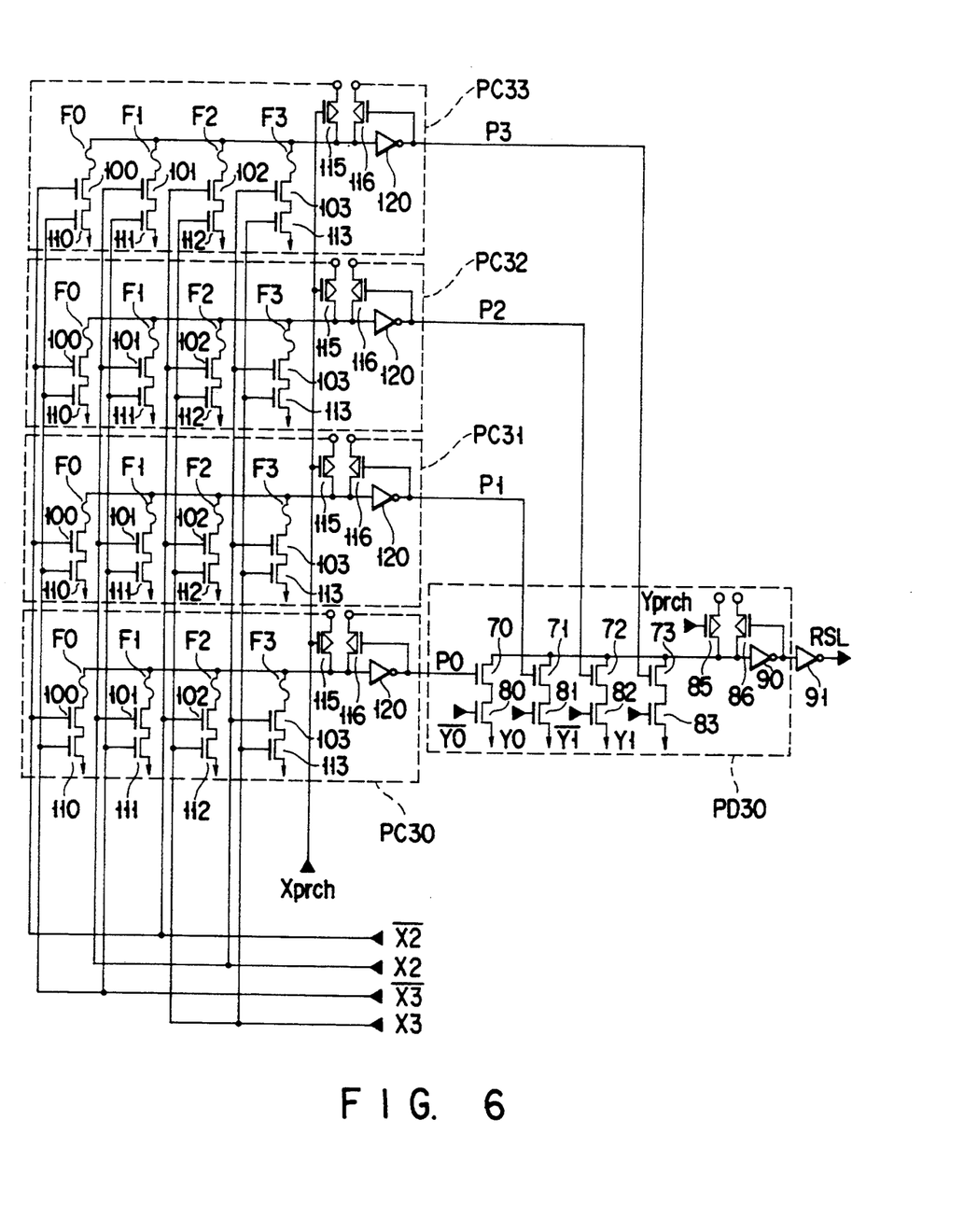
FIG. 6 shows another block of the block diagram of FIG. 1.

FIG. 6 is a circuit diagram showing a major section of a third embodiment according to the present invention—specifically, a circuit arrangement for defective memory replacement as indicated by the block 11 in FIG. 1.

Programming circuits PC30, PC31, PC32 and PC33 are configured as described below.

N channel MOS transistors 100, 101, 102, and 103 are each connected at a drain to a corresponding one terminal of fuses F0, F1, F2, and F3, and at a source to a corresponding source of N channel MOS transistors 110, 111, 112, and 113.

The upper addresses (X2, X3) of row addresses or their inverted replicas are input to the gates of MOS transistors 100 to 103 and 110 to 113, as shown in FIG. 6.

P channel MOS transistors 115 and 116 for power supply are each connected at a drain to the other terminal of a corresponding one of the fuses F0, F1, F2, and F3. A signal Xprch showing that the row address is determined is input to the gate of MOS transistor 115. An inverter 120 for delivering a program signal is connected to a drain-to-gate circuit of MOS transistor 116. With this arrangement, the program signals P0, P1, P2, and P3 are output through inverters 120, 120, 120, and 120, respectively, in the programming circuits PC30, PC31, PC32, and PC33.

A programmable decoder PD30 supplied with program signals P0, P1, P2, and P3 has the same arrangement as the programmable decoder PD20 shown in FIG. 5, and thus explanation regarding corresponding parts or elements with the same reference numerals is omitted.

It is also possible to obtain the same advantage in the embodiment shown in FIG. 6 as that in the embodiment shown in FIG. 5. Various changes or modifications of the programming circuit may be thus made, and regardless of arrangement, the outputs of programming circuits can be determined prior to the inputting of the column address unless the column address is connected to the input of the programming circuit. For this reason, the programmable decoder having its decoding state varied by the outputs of the programming circuits can output a redundancy memory cell select signal with only a small delay time from inputting of the column address.

Figure 7:
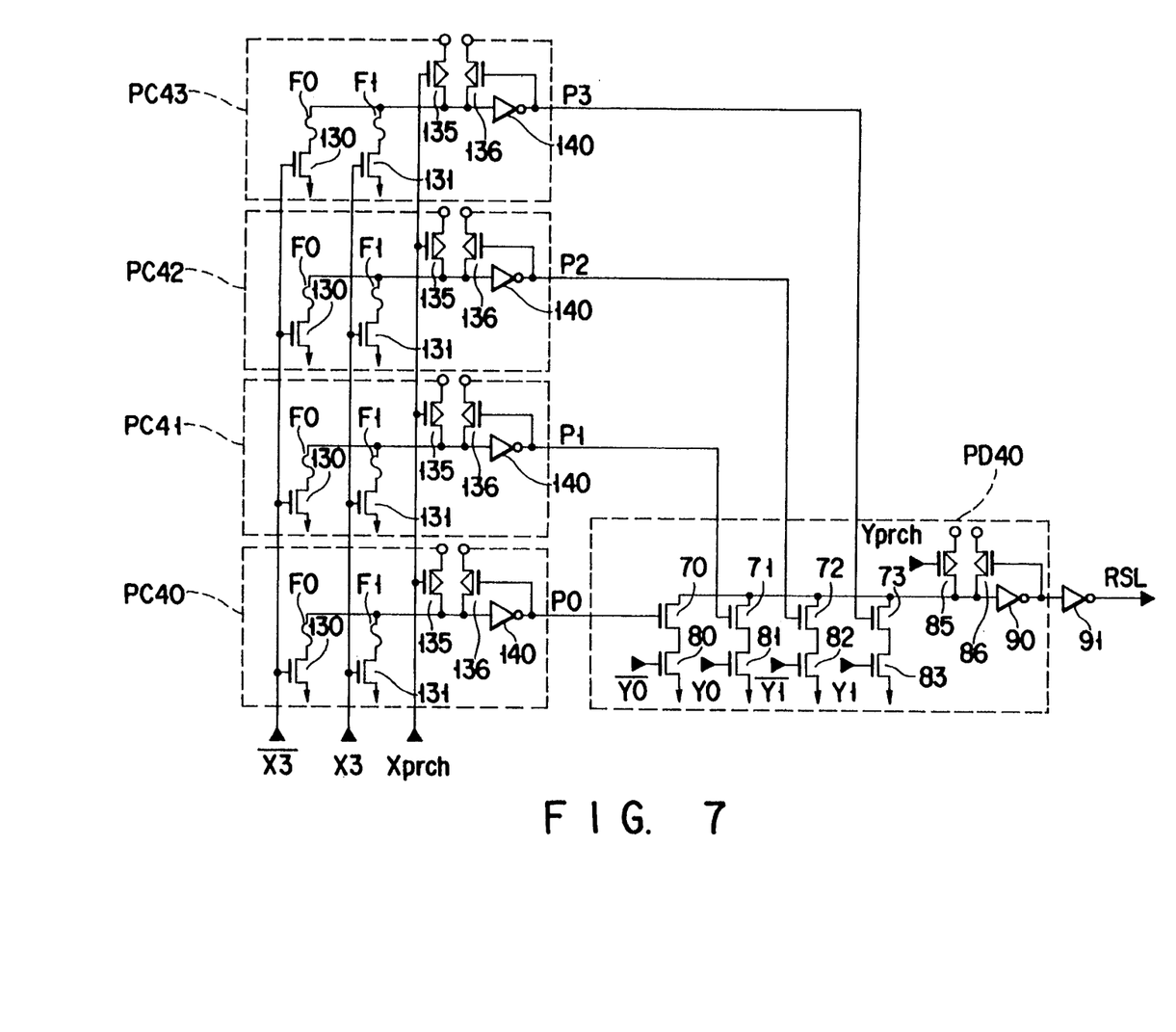
FIG. 7 shows still another block of the block diagram of FIG. 1.

FIG. 7 is a circuit diagram showing a major section of a fourth embodiment according to the present invention—specifically, a circuit arrangement for defective memory replacement as indicated by the block 11 in FIG. 1.

Programming circuits PC40, PC41, PC42 and PC43, shown in FIG. 7, are configured as described below.

As shown in FIG. 7, N channel MOS transistors 130 and 131 are connected at their drains to fuses F0 and F1, respectively. A portion (X3) of the upper addresses of row addresses and its inverted replica are input to the transistors 131 and 130, respectively.

P channel MOS transistors 135 and 136 for power supply are connected at their drains to the remaining terminals of the fuses F0 and F1. A signal Xprch showing that the row address is determined is input to the gate of MOS transistor 135. An inverter 140 is connected to the drain-to-gate circuit of MOS transistor 136 to output the corresponding program signal. With this arrangement, program signals P0, P1, P2, and P3 are output from the inverters 140, 140, 140, and 140, respectively, in the programming circuits PC40, PC41, PC42, and PC43.

A programmable decoder PD40 supplied with program signals P0, P1, P2, and P3 has the same arrangement as the programmable decoder PD20 in FIG. 5, and thus explanation regarding corresponding parts or elements with the same reference numerals is omitted.

In the arrangement shown in FIG. 7, only the upper one bit (X3) of the row addresses is input to programming circuits PC40, PC41, PC42, and PC43. As a result, the column address of the defective memory cell cannot be programmed for each memory array, thus lowering the percentage of defective memory cells which can be replaced. It is, however, possible to reduce the number of fuses in the respective programming circuit. In the arrangement of this embodiment, the percentage of defective memory cells which can be replaced is reduced by about ½ compared to the embodiments shown in FIGS. 5 and 6, and the number of requisite fuses is one half that of these embodiments. Although, in the respective embodiments, explanation has been restricted to columnwise defective memory replacement, the present invention is not restricted thereto. The same can be said as regards rowwise defective memory replacements. The present invention relates to a defective memory replacement method in which a plurality of divided memory arrays share a column decoder or a row decoder or both. Various arrangements may be considered depending upon the memory access system employed. As a result, it is possible to greatly reduce the waiting time necessary from the inputting of the address to the outputting of a redundancy memory cell select signal. As described above, according to the present invention, the programming circuit is operated by use of an earlier input address and the programmable decoder at the next stage has its decoding state varied by the output of the programming circuit. Therefore, it is possible to provide a semiconductor memory device which enables the programmable decoder to output, with a only very small delay time from the inputting of the address, a signal indicating whether or not a redundancy memory cell is selected.

Additional advantages and modifications will readily occur to those skilled in the art. Thus, the invention in its broader aspects is not limited to the specific details and representative devices shown and described herein. Accordingly, various modifications may be made without departing from the spirit or scope of the general inventive concept as defined by the appended claims and their equivalents.

What is claimed is:

1. A semiconductor memory device comprising:
a plurality of memory cell arrays;
a plurality of first decoders for decoding a first memory address, each of said first decoders being connected to a corresponding memory cell array;
a second decoder connected to each memory cell array for decoding a second memory address;
a plurality of redundancy memory cells, each arranged for a corresponding memory cell array;
a plurality of programming circuits, each of said programming circuits corresponding to one of said memory cell arrays, and each receiving the first memory address and outputting a signal of a predetermined logic level corresponding to a defective memory cell in a corresponding one of said memory cell arrays; and a programmable decoder for receiving the second memory address and the output signals from said programming circuits, for controlling a decoding state of the second memory address according to the logic levels of the output signals from said programming circuits and for outputting a redundancy memory cell select signal which selects one of said redundancy memory cells to replace a specified defective memory cell based on the decoding state.

2. The memory cell device according to claim 1, wherein the first memory address is input to said plurality of programming circuits and thereafter the second memory address is input to said programmable decoder and to said second decoder.

3. A semiconductor memory device comprising:
a plurality of memory cell arrays;
a plurality of first decoders for decoding a first memory address, each of said first decoders being connected to a corresponding memory cell array;
a second decoder connected to each memory cell array for decoding a second memory address;
a plurality of redundancy memory cells, each arranged for a corresponding memory cell array;
a plurality of programming circuits, each of said programming circuits corresponding to one of said memory cell arrays, and each receiving the first memory address and outputting a signal of a predetermined logic level corresponding to a defective memory cell in the corresponding one of said memory cell arrays; and
a programmable decoder for receiving the second memory address and the output signals from said programming circuits, for controlling a decoding state of the second memory address according to the logic levels of the output signals from said programming circuits and for outputting a redundancy memory cell select signal which inhibits the second memory address from selecting a specific defective memory cell and selects one of said redundancy memory cells to replace said specified defective memory cell based on the decoding state.

4. The memory cell device according to claim 3, wherein the first memory address is input to said plurality of programming circuits and thereafter the second memory address is input to said programmable decoder and to said second decoder.

5. The semiconductor memory device of claim 1, further comprising a plurality of sense amplifiers, each being connected to a corresponding memory cell array.

6. The semiconductor memory device of claim 3, further comprising a plurality of sense amplifiers, each being connected to a corresponding memory cell array.

7. A semiconductor memory device comprising:
a plurality of memory cell arrays, each memory cell array including memory cells connected to word lines and bit lines and addressed in accordance with a row address and a column address;
a plurality of row decoders, connected to respective ones of said memory cell arrays, for decoding the row address;
a column decoder coupled to every memory cell array for decoding the column address;

a plurality of redundancy memory cells corresponding to respective ones of said memory cell arrays;
a plurality of programming circuits, each programming circuit corresponding to a respective one of said memory cell arrays, and each receiving the row address and outputting a signal of a predetermined logic level in accordance with a detection of a defective memory cell in the corresponding respective one of said memory cell arrays; and
a programmable decoder for receiving the output signals from said programming circuits and the column address, for setting a decoding state of the column address according to the logic level of the output signals from said programming circuits and for generating a redundancy memory cell select signal for selecting one of said redundancy memory cells to replace the detected defective memory cell based on the set decoding state.

8. An address multiplexer memory device, comprising:
a plurality of memory cell arrays, each including a plurality of memory cells arranged in a matrix form, a redundant bit line, a row decoder circuit and a sense amplifier, said memory cells in the same row being connected to a word line, and said memory cells in the same column being connected to a bit line, and said memory cell arrays being selected in accordance with an externally supplied row address signal;
a plurality of programming circuits, each including an array of storage means for receiving said row address signal and for storing a defective memory cell address, said storage means generating a program signal of a predetermined level corresponding to said defective memory cell address;
a logic circuit for receiving the program signal of one of said programming circuits and an externally supplied column address signal and for generating a redundancy memory cell select signal; and
a column decoder circuit for receiving said column address signal and said redundancy memory cell select signal, and for selecting said bit line in accordance with said column address signal and selecting said redundant bit line, and for not selecting said bit line;
wherein said row address signal is supplied to said plurality of programming circuits and thereafter said column address signal is supplied to said logic circuit and to said column decoder.

9. The memory cell device according to claim 8, wherein said storage means includes fuses.

10. The memory cell device according to claim 8, wherein said storage means includes a plurality of series circuits, each circuit comprising a first MOS transistor and a fuse and being arranged in parallel with each other, and a gate of the first MOS transistor being supplied with a memory cell array selection signal obtained by decoding a row address from said row address signal.

11. The memory cell device according to claim 10, wherein said storage means further comprises second and third MOS transistors, drains of the second and third MOS transistors being connected to said fuse, the gate of the first MOS transistor being supplied with a signal representing a determination of said row address, and a gate of the third MOS transistor being connected to a drain thereof through an inverter.

12. The memory cell device according to claim 8, wherein said storage means includes a plurality of series circuits, each circuit being composed of a fuse, a first MOS transistor and a second MOS transistor.

13. The memory cell device according to claim 12, wherein the gates of said first and second MOS transistors are supplied with said row address signal and said row address signal inverted.

14. The memory cell device according to claim 12, wherein the gates of said first and second MOS transistors are supplied with said column address signal and said column address signal inverted.

15. The memory cell device according to claim 8, wherein said storage means includes a plurality of series circuits, each circuit being composed of a first MOS transistor and a fuse and being arranged in parallel with each other, and a gate of the first MOS transistor being supplied with a memory cell array selection signal obtained by decoding a column address from said column address signal.

16. The memory cell device according to claim 15, wherein said storage means further comprises second and third MOS transistors, drains of the second and third MOS transistors being connected to said fuse, the gate of the first MOS transistor being supplied with a signal representing a determination of said column address and a gate of the third MOS transistor being connected to the drain thereof through an inverter.

* * * * *